United States Patent
Clifton et al.

(10) Patent No.: US 10,084,091 B2
(45) Date of Patent: Sep. 25, 2018

(54) STRAINED SEMICONDUCTOR USING ELASTIC EDGE RELAXATION OF A STRESSOR COMBINED WITH BURIED INSULATING LAYER

(71) Applicant: Acorn Technologies, Inc., La Jolla, CA (US)

(72) Inventors: Paul A. Clifton, Redwood City, CA (US); R. Stockton Gaines, Pacific Palisades, CA (US)

(73) Assignee: Acorn Technologies, Inc., La Jolla, CA (US)

( * ) Notice: Subject to any disclaimer, the term of this patent is extended or adjusted under 35 U.S.C. 154(b) by 0 days.

(21) Appl. No.: 15/594,436

(22) Filed: May 12, 2017

(65) Prior Publication Data

US 2017/0250283 A1    Aug. 31, 2017

Related U.S. Application Data

(60) Continuation of application No. 15/191,369, filed on Jun. 23, 2016, now Pat. No. 9,673,327, which is a
(Continued)

(51) Int. Cl.
*H01L 31/117* (2006.01)
*H01L 29/78* (2006.01)
(Continued)

(52) U.S. Cl.
CPC .... *H01L 29/7849* (2013.01); *H01L 21/76254* (2013.01); *H01L 21/76283* (2013.01);
(Continued)

(58) Field of Classification Search
CPC ............... H01L 29/105; H01L 29/1054; H01L 29/7849; H01L 21/02381; H01L 21/0245;
(Continued)

(56) References Cited

U.S. PATENT DOCUMENTS 4,994,866 A    2/1991 Awano
5,155,571 A    10/1992 Wang et al.
(Continued)

FOREIGN PATENT DOCUMENTS

EP    0123163 A2    10/1984
WO    2011/115859 A2    9/2011

OTHER PUBLICATIONS

Arghavani, et al., "A Reliable and Manufacturable Method to Induce a Stress of >1 GPa on a P-Channel MOSFET in High Volume Manufacturing" Santa Clarita, California 95054, IEEE Electron Device Letters, vol. 27, No. 2, Feb. 2006, pp. 114-116.
(Continued)

*Primary Examiner* — Matthew E Warren
(74) *Attorney, Agent, or Firm* — Ascenda Law Group, PC

(57) ABSTRACT

An SOI wafer contains a compressively stressed buried insulator structure. In one example, the stressed buried insulator (BOX) may be formed on a host wafer by forming silicon oxide, silicon nitride and silicon oxide layers so that the silicon nitride layer is compressively stressed. Wafer bonding provides the surface silicon layer over the stressed insulator layer. Preferred implementations of the invention form MOS transistors by etching isolation trenches into a preferred SOI substrate having a stressed BOX structure to define transistor active areas on the surface of the SOI substrate. Most preferably the trenches are formed deep enough to penetrate through the stressed BOX structure and some distance into the underlying silicon portion of the substrate. The overlying silicon active regions will have tensile stress induced due to elastic edge relaxation.

11 Claims, 7 Drawing Sheets

Related U.S. Application Data division of application No. 13/762,677, filed on Feb. 8, 2013, now Pat. No. 9,406,798, which is a continuation of application No. 12/869,978, filed on Aug. 27, 2010, now Pat. No. 8,395,213.

(51) Int. Cl.
| | |
|---|---|
| *H01L 21/762* | (2006.01) |
| *H01L 29/786* | (2006.01) |
| *H01L 29/66* | (2006.01) |
| *H01L 29/10* | (2006.01) |

(52) U.S. Cl.
CPC .... *H01L 29/1054* (2013.01); *H01L 29/66742* (2013.01); *H01L 29/7846* (2013.01); *H01L 29/78603* (2013.01)

(58) Field of Classification Search
CPC .......... H01L 21/02532; H01L 21/7624; H01L 21/76251; H01L 21/76254; H01L 21/76283; H01L 21/823412
USPC ... 257/18, 19, 190, 192, 347, 507, 614, 615, 257/616
See application file for complete search history.

(56) References Cited

U.S. PATENT DOCUMENTS

| | | | |
|---|---|---|---|
| 5,503,704 A | 4/1996 | Bower et al. | |
| 5,904,860 A | 5/1999 | Nagakubo et al. | |
| 6,406,973 B1 | 6/2002 | Lee | |
| 6,492,216 B1 | 12/2002 | Yeo et al. | |
| 6,498,359 B2 | 12/2002 | Schmidt et al. | |
| 6,583,437 B2 | 6/2003 | Mizuno et al. | |
| 6,600,170 B1 | 7/2003 | Xiang | |
| 6,707,106 B1 | 3/2004 | Wristers et al. | |
| 6,881,635 B1 | 4/2005 | Chidambarrao et al. | |
| 6,927,138 B2 | 8/2005 | Takenaka | |
| 7,019,326 B2 | 3/2006 | Cea et al. | |
| 7,138,310 B2 | 11/2006 | Currie et al. | |
| 7,202,513 B1 | 4/2007 | Chidambarrao et al. | |
| 7,338,834 B2 * | 3/2008 | Clifton ................ | H01L 29/1054 257/19 |
| 7,388,278 B2 | 6/2008 | Holt et al. | |
| 7,524,740 B1 | 4/2009 | Liu et al. | |
| 7,534,701 B2 | 5/2009 | Ghyselen et al. | |
| 7,585,711 B2 | 9/2009 | Chen et al. | |
| 7,700,416 B1 | 4/2010 | Clifton et al. | |
| 7,825,470 B2 | 11/2010 | Atanakovic | |
| 7,897,444 B2 | 3/2011 | Adam et al. | |
| 8,115,254 B2 | 2/2012 | Zhu et al. | |
| 8,368,143 B2 | 2/2013 | Bedell et al. | |
| 2001/0048119 A1 | 12/2001 | Mizuno et al. | |
| 2003/0089901 A1 | 5/2003 | Fitzgerald | |
| 2004/0021179 A1 | 2/2004 | Lee et al. | |
| 2004/0026765 A1 | 2/2004 | Currie et al. | |
| 2005/0093021 A1 | 5/2005 | Ouyang et al. | |
| 2005/0106792 A1 | 5/2005 | Cea et al. | |
| 2005/0133817 A1 | 6/2005 | Huang et al. | |
| 2005/0255667 A1 | 11/2005 | Arghavani et al. | |
| 2006/0081837 A1 | 4/2006 | Bedell et al. | |
| 2007/0164356 A1 * | 7/2007 | Adam ............... | H01L 21/76243 257/347 |
| 2007/0257249 A1 | 11/2007 | Mocuta et al. | |
| 2008/0116517 A1 | 5/2008 | Anderson et al. | |
| 2008/0124858 A1 | 5/2008 | Nguyen et al. | |
| 2008/0179636 A1 | 7/2008 | Chidambarrao et al. | |
| 2008/0242097 A1 | 10/2008 | Boescke et al. | |
| 2009/0104746 A1 | 4/2009 | Clifton et al. | |
| 2009/0166866 A1 | 7/2009 | Fastow et al. | |
| 2009/0221115 A1 | 9/2009 | Scott et al. | |
| 2009/0278201 A1 | 11/2009 | Chatty et al. | |
| 2011/0230026 A1 | 9/2011 | Clifton | |
| 2012/0139081 A1 | 6/2012 | Zhu et al. | |
| 2013/0196456 A1 | 8/2013 | Morvan et al. | |

OTHER PUBLICATIONS

Bower, et al., "Low Temperature Si3N4 Direct Bonding," Department of Electrical and Computer Engineering, University of California, Department of Mechanical, Aeronautical and Material Engineering, University of California, Davis, CA 95616, Appl. Phys. Lett. 62 (26), Jun. 28, 1993, pp. 3485-3487.

Chung, et al. More Strain and Less Stress—The Guideline for Developing High-End Strained CMOS Technologies with Acceptable Reliability, National Chiao Tung University, Taiwan, 2008, pp. 435-438.

Doll, et al., "Versatile Low Temperature Wafer Bonding and Bond Strength Measurement by a Blister Test Method," Laboratory for Design of Microsystems, Institute for Microsystem Technologies (IMTEK), University of Freiburg, Georges-Koehler-Allee 102, 79110 Freiburg, Germany, Microsyst Technol (2006) pp. 418-429, Oct. 7, 2005.

Eernisse, "Stress in Ion-Implanted CVD Si3N4 Films," Sandia Laboratories, Albuquerque, New Mexico 87115, Journal of Applied Physics, vol. 48, No. 8, Aug. 1977, pp. 3337-3341.

Fischer et al., "Elastic Misfit Stress Relaxation in Heteroepitaxial SiGe/Si Mesa Structures," Institute of Semiconductor Physics, Frankfurt, Germany, Sep. 22, 1992, pp. 2656-2658.

Gannavaram, et al. "Low Temperature (≤800° C.) Recessed Junction Selective Silicon-Germanium Source/Drain Technology for Sub-70 nm CMOS," North Carolina State University (2000), Raleigh, NC, pp. 437-440.

Harendt, et al., "Silicon Fusion Bonding and Its Characterization," Institute for Microelectronics Stuttgart, Allmandring 30a. D-7000 Stuttgart 80, Federal Republic of Germany, ]. Micromech, Microeng 2 (1992) Sep. 1, 1992, pp. 113-116.

Hollander, et al. "Strain Relaxation of Pseudomorphic Si1 xGex/ Si(100) Heterostructures by Si+ ion implantation," Nuclear Instruments and Methods in Physics Research B 242, 2006, pp. 568-571.

Hsu, et al., "Low Temperature LPCVD SiN Direct Bonding for Sensors," DIMES-ECTM, Delft University of Technology, Faculty of Electrical Engineering, Mathematics and Computer Science; DIMESEI, Delft University of Technology, Faculty of Electrical Engineering, Mathematics and Computer Science, Dept. of Microelectronics, Mekelweg 4, 2628 CD Delft, the Netherlands; Oct. 2005, pp. 162-166.

Jain, et al., "Stresses and Strains in Lattice-Mismatched Stripes, Quantum Wires, Quantum Dots, and Substrates in Si Technology," Applied Physics Reviews, 79(11), Jun. 1996. pp. 8145-8165.

Jan, et al., "A 45mm Low Power System-Pm-Chip Technology with Dual Gate (Logic and I/O) High-k/Metal Gate Strained Silicon Transistors", Logic Technology Development, Intel Corporation, Hillsboro, Oregon, downloaded Jul. 22, 2009, 4 pages.

Kawasaki et al., "Impact of Parasitic Resistance and Silicon Layer Thickness Scaling for Strained-Silicon MOSFETs on Relaxed Si1-xGex Virtual Substrate" SOC Research & Development Center and System LSI Division (2004), Toshiba Corporation Semiconductor Company, Yokohama Japan, 4 pages.

Li, et al., "Systematic Low Temperature Silicon Bonding Using Pressure and Temperature," Department of Electrical and Computer Engineering, University of California Davis, Davis, CA 95616, USA, Jpn. J. Appl. Phys., vol. 37 (1998) pp. 737-741, Part 1, No. 3A, Mar. 15, 1998.

Miclaus, et al., "Wafer Bonding of (211) Cd0.96Zn0.04 Te on (001) Silicon," University of California, Los Angeles, Department of Materials Science and Engineering, Los Angeles, CA 90005; Raytheon Vision Systems, Goleta, CA 93117, pp. 552-555, Jun. 2004.

PCT International Search Report dated Jul. 30, 2003, from the European Patent Office, for International Patent Application No. PCT/US03/10180 (filed Apr. 2, 2003), 7 pages.

PCT International Search Report and Written Opinion dated Feb. 8, 2006, from the European Patent Office, for International Patent Application No. PCT/US05/0235335 (filed Jul. 15, 2005), 13 pages.

PCT International Search Report and Written Opinion dated Sep. 28, 2007, from the European Patent Office, for International Patent Application No. PCT/US07/006171 (filed Mar. 17, 2006), 11 pages.

(56) References Cited

OTHER PUBLICATIONS

PCT International Search Report and Written Opinion dated Nov. 2, 2011, from the European Patent Office, for International Patent Application No. PCT/US11/049106 (filed Aug. 25, 2011), 11 pages.

Shi, et al, "Modifying Residual Stress and Stress Gradient in LPCVD Si3N4 Film with Ion Implantation," National Key Laboratory of Nano/Micro Fabrication Technology, Institute of Microelectronics, Peking University, Beijing 100871, PR China, Nov. 21, 2005, pp. 352-357.

Tabata, et al., "Control of Internal Stress and Young's Modulus of Si3N4 and Polycrystalline Silicon Thin Films Using the Ion Implantation Technique," Toyota Central Research and Development Laboratories Inc., Nagakute-cho, Aichi-gun, Aichi-ken 480-11, Japan, American Institute of Physics, Appl. Phys. Lett 56 (14), Apr. 12, 1990 pp. 1314-1316.

Thompson, et al. "A 90-NM Logic Technology Featuring Strained-Silicon" Logic Technology Development, Intel Corporation, Hillsboro, OR, 2004, pp. 1790-1797.

Vyatkin, "The Role of Point Defects in Strain Relaxation in Epitaxially Grown SiGe Structures," Elsevier B.V., Russia, Nov. 18, 2005, pp. 90-95.

Watanabe, et al., "A Low Power 40nm CMOS Technology Featuring Extremely High Density of Logic (2100kGate/nm2) and SRAM (0.195f.μm2) for Wide Range of Mobile Applications with Wireless System" System LS1 Division, Toshiba Corporation, Yokohama, Japan, downloaded Jul. 22, 2009, 4 pages.

Wiegand, et al., "Wafer Bonding of Silicon Wafers Covered with Various Surface Layers," Max-Planck Institut fur Mikrostrukturphysik, Weinberg 2, Halle an der Saale D-06120, Germany, CIS, Centrum fur Mikrosensorik E.V., Haarbergstrasse 61, Erfurt D-99097, Germany, Elsevier Science B.V., Oct. 16, 2000, pp. 91-95.

Yamamoto, et al., "Effect of Low-Dose Ion Implantation on the Stress of Low-Pressure Chemical Vapor Deposited Silicon Nitride Films," ULSI Device Development Laboratories, NEC Corporation, Shomokuzawa 1120, Saganihara, Kanagawa,Japan,Jpn.J. Appl. Phys., vol. 37 (1998) pp. 1256-1259, Part 1, No. 3B, Mar. 3, 1998.

Yin et al., "Uniaxial Strain Relaxation on Ultra-thin Strained-Si Directly on Insulator (SSDOI) Substrates," International Conference on Solid-State and Integrated Circuit Technology Proceedings, Oct. 2006, pp. 136-138.

Yin, et al., "Strain Partition of Si/SiGe and SiO2/SiGe on Compliant Substrates," Applied Physics Letters, vol. 82, No. 22,Jun. 2003, pp. 3853-3855.

Zhuang, et al. "Strain Relaxation in Periodic Arrays of Si/SiGe Quantum Wires Determined by Coplanar High-Resolution X-Ray Diffraction and Grazing Incidence Diffraction,"]. Phys. D: Appl. Phys. 32 (1999), UK, pp. A224-A229.

Korean Patent Appl. 10-2013-7006498, Notification of Provisional Rejection dated Dec. 26, 2013, 6 pages.

German Application No. 11 2011 102 840.7, Office Action dated Jun. 26, 2014, 7 pages.

\* cited by examiner

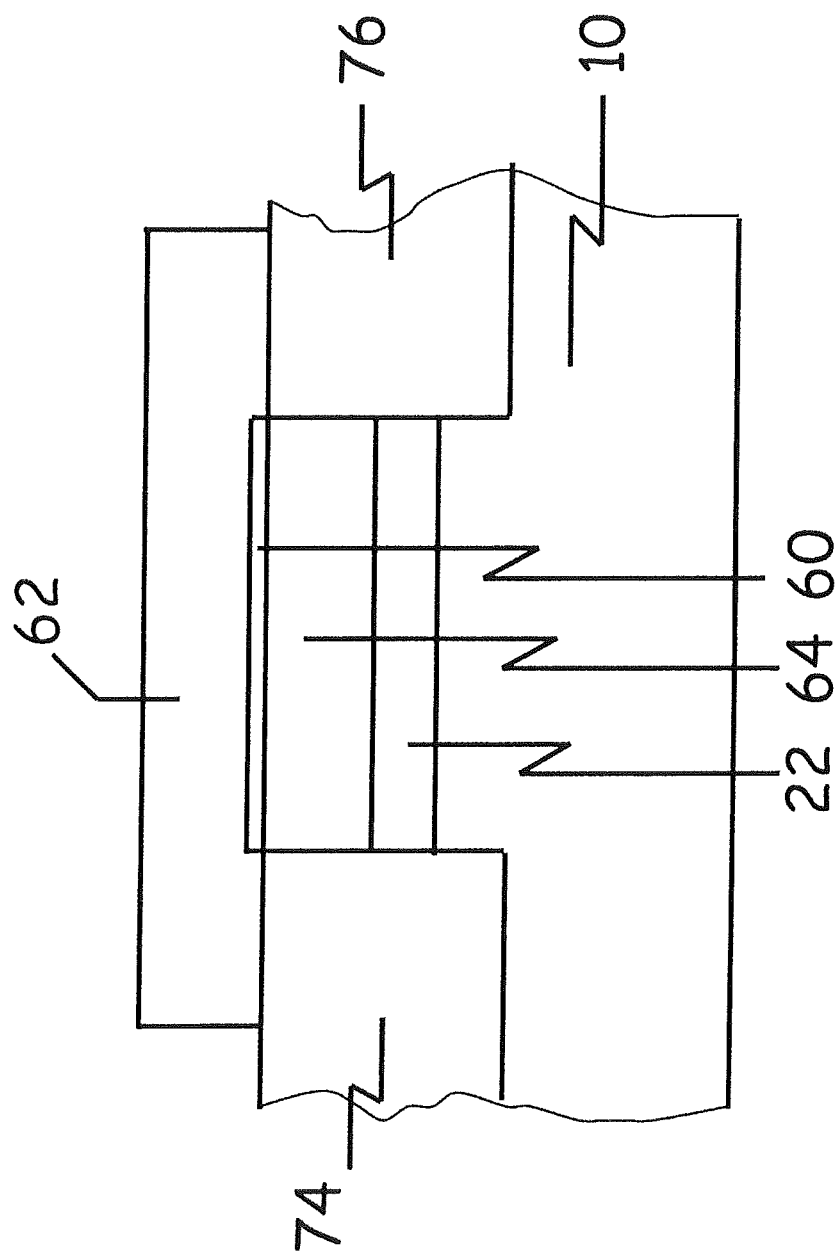

STRAINED SEMICONDUCTOR USING ELASTIC EDGE RELAXATION OF A STRESSOR COMBINED WITH BURIED INSULATING LAYER

CROSS REFERENCE TO RELATED APPLICATIONS

This application is a CONTINUATION of U.S. application Ser. No. 15/191,369, filed Jun. 23, 2016, which is a DIVISIONAL of U.S. application Ser. No. 13/762,677, filed Feb. 8, 2013, now U.S. Pat. No. 9,406,798, which is a CONTINUATION of U.S. application Ser. No. 12/869,978, filed Aug. 27, 2010, now U.S. Pat. No. 8,395,213, each of which are incorporated by reference in their respective entireties.

FIELD OF THE INVENTION

The present invention relates to strained semiconductor on insulator devices, some of which incorporate strained active layers containing silicon, and to silicon on insulator (SOI) substrates having compressive or tensilely stressed buried insulator structures. The present invention more specifically relates to MOS devices formed using SOI substrates having a buried, compressively stressed insulating layer to provide MOS devices with strained silicon active regions and to methods of making such MOS devices.

BACKGROUND

Strained silicon is widely viewed as an important technology for obtaining desired advancements in integrated circuit performance. Mobility enhancement results from a combination of reduced effective carrier mass and reduced intervalley (phonon) scattering. n-channel MOS field effect transistors (FET) achieve improved performance with induced biaxial tensile stress in the top silicon layer along both the width and length axes of the active area. p-channel MOSFETs exhibit improved performance with induced uniaxial tensile stress in the top silicon layer along the width axis only (transverse tensile stress). p-channel MOSFETs also exhibit improved performance with induced uniaxial compressive stress in the top silicon layer along the length axis only (longitudinal compressive stress). Compressive stress can be provided selectively in a silicon surface layer, for example, by using selective epitaxial SiGe stressors in the source and drain regions of a MOSFET to induce a desired compressive stress along the length axis (longitudinal).

Strained silicon is conventionally obtained by first growing a thick layer of silicon germanium alloy (SiGe) on a silicon substrate. The SiGe layer is grown to a sufficient thickness that the SiGe layer is relaxed to an unstrained condition at its surface. The in-plane lattice parameter of the SiGe surface is similar to that of a bulk crystal of SiGe of the same composition. SiGe alloys have larger lattice parameters than silicon. Hence the relaxed surface of the SiGe layer provides an in-plane lattice parameter larger than that of silicon. A subsequent thin layer of silicon is grown epitaxially on the relaxed surface of the SiGe layer. The thin epitaxial layer of silicon assumes the larger in-plane lattice parameter of the SiGe and grows in a strained state with bonds in the crystal lattice elongated in the growth plane. This approach, sometimes known as substrate-strained silicon or "virtual substrate" technology, grows a thin pseudomorphic layer of strained silicon on the relaxed surface of a SiGe layer.

So long as the strained silicon layer does not exceed a "critical thickness" for strain relaxation and some care is taken, the tensile strain is maintained in the strained silicon layer through the various implantation and thermal processing steps typical of CMOS manufacturing.

The use of relaxed SiGe as a "virtual substrate" to strain a subsequently deposited epitaxial silicon layer inevitably requires acceptance of a very high dislocation density in the SiGe layer because the SiGe relaxation mechanism is plastic in nature. In other words, relaxation in the SiGe layer occurs through the generation of strain-relieving misfit dislocations. A thin SiGe layer of suitable germanium concentration grown epitaxially on a silicon substrate is not strain relaxed and exhibits few misfit dislocations if the SiGe layer is not thicker than a "critical thickness" at which misfit dislocations are generated. On the other hand, if the SiGe layer is thicker than the "critical thickness," the strained SiGe lattice undergoes plastic deformation and most or all of the misfit strain is relieved by the nucleation and propagation of misfit dislocations. Some fraction of the resulting misfit dislocations gives rise to threading dislocations (at least $10^4$-$10^5$ $cm^{-2}$) which propagate through the overlying strained silicon layer. Threading dislocations represent extended defects and give rise to multiple undesirable consequences in MOSFETs including source/drain junction leakage, reduction of channel mobility, variability of threshold voltage and enhanced diffusion paths leading to potential drain-to-source shorting in short-channel MOSFETs.

Silicon-on-insulator wafers afford certain advantages over conventional bulk silicon wafers and are gaining in importance in CMOS manufacturing. An SOI wafer may, for example, have a layer of silicon on top of a layer of insulator. In silicon-on-sapphire (SOS) technology, the insulator is a wafer of sapphire (crystalline aluminum oxide). Commercial exploitation of SOS is rather limited due to high wafer costs, limited wafer diameters and supply. SOI with a buried oxide layer between the top (active) silicon structure and an underlying crystalline silicon host or 'handle' wafer is the preferred SOI configuration for CMOS applications. The buried oxide (typically abbreviated to "BOX") layer structure may be formed by high dose implantation of oxygen and annealing (accomplished, for example, using the so-called SIMOX process). The BOX layer may also be formed by wafer bonding a layer of silicon from a donor wafer to a BOX layer on a handle wafer. The bonded thin silicon layer may be separated from the donor wafer by subjecting the donor wafer to hydrogen ion implantation prior to bonding to create a defect layer at a depth corresponding to the desired thickness of the thin silicon layer and subsequently applying a force to laterally section the silicon on insulator wafer structure along the plane of the damage layer and so separate the silicon on insulator wafer from the donor wafer. An example of a process that forms BOX layers by this method is described in U.S. Pat. No. 6,372,609. Wafers manufactured according to the Smart Cut process are commercially available from Soitec, Inc., of Bernin, France. The BOX layers of conventional SOI wafers are not compressively stressed.

If the silicon layer on top of the BOX layer is thicker than approximately 50 nm, the silicon layer will not be fully depleted in normal operation of CMOS transistors. Such wafers are known as partially-depleted SOI. If the silicon layer on top of the BOX layer is thinner than approximately 50 nm, the silicon layer may be fully depleted in normal operation of CMOS transistors and such wafers are known as fully-depleted SOI (also known as ultra-thin body SOI). Ultra-thin body, fully depleted MOSFETs fabricated in ultra-thin SOI have multiple beneficial features which each contribute to improved transistor and integrated circuit performance including low sensitivity to semiconductor body doping, low source and drain junction capacitances, improved electrical isolation between neighboring MOSFETs and improved control of short channel effects.

A fully depleted SOI technology in which the semiconductor active regions have in-plane tensile strain could have the combined benefits of ultra-thin body semiconductor-on-insulator and of strained silicon. Various approaches to obtaining "strained silicon on insulator" have been described. U.S. Pat. No. 7,534,701 to Ghyselen, et al. describes a strained silicon-on-insulator manufacturing method wherein a blanket strained silicon layer is first formed on a relaxed surface of single crystal silicon germanium and subsequently bonded to a handle wafer with an oxide layer such that the strained silicon layer is transferred to the handle wafer. The tensile strain is retained in the thin strained silicon layer after separation of the silicon germanium, for example, by the previously described SmartCut process.

U.S. Pat. No. 6,372,609 to Wristers, et. al., describes forming an SOI wafer with a buried, compressively stressed silicon nitride layer in an ineffective attempt to create tensile strain in the thin top (surface) silicon layer. The Wristers patent does not in fact induce effective strain in the top semiconductor layer. The process described in the Wristers patent, forms a BOX structure including a layer of compressively stressed silicon nitride and the final device structure includes the BOX structure positioned between an active region and a substrate. However, the compressively stressed silicon nitride layer is continuous (uninterrupted) in the plane of the wafer and so cannot expand or contract laterally from the as-formed configuration. There is no opportunity for edge relaxation of the buried stressed silicon nitride layer and as such the Wristers patent provides no mechanism for inducing strain in the silicon active region or for relaxing the compressively stressed buried silicon nitride layer.

U.S. Patent Publication No. 2009/0278201 to Chatty, et al., describes strained channel MOSFET devices on SOI wafers. The starting point is a wafer with a buried silicon oxide layer (BOX) on a substrate, with a silicon nitride layer above that and a surface active silicon layer in which MOSFETs will be constructed. This silicon nitride layer may be deposited in a state of compressive or tensile stress up to a maximum magnitude of 200 MPa. From this starting point, isolation trenches are cut through the active silicon layer and the silicon nitride layer underneath it, but stop at the BOX. Then some of the source and drain silicon in the active layer is removed and replaced with a compressive or tensile stressed material (e.g. silicon germanium or silicon:carbon respectively) so as to induce longitudinal compressive or tensile strain in the channel region of the MOSFET. Instead of obtaining significant strain in the channel region from edge relaxation and expansion of the silicon nitride layer, in the Chatty publication, the primary method of inducing strain in the channel region is the well known "embedded source/drain stressor" method. The Chatty publication focuses on using a buried silicon nitride layer as a stiffener against which the force of an embedded stressor in source/drain regions can react to create the desired strain in the channel region. The publication explains that if there is no source/drain embedded stressor present, measurements show that there is no difference in the stress in the channel either when (1) the silicon nitride stiffening layer is present or (2) the silicon nitride stressor is not present. It is clear, therefore, that the Chatty publication does not attempt to induce stress in the channel by the use of a buried silicon nitride stressor together with edge relaxation.

SUMMARY OF THE INVENTION

An aspect of the invention provides a method of manufacturing a semiconductor device including providing a semiconductor on insulator (SOI) substrate having a stressed buried insulator structure above a base substrate. The SOI substrate has a surface semiconductor layer. The method proceeds by etching through the surface semiconductor layer, the stressed buried insulator structure and into the base substrate in a pattern defined by a mask layer. Etching through the stressed buried insulator structure causes in-plane strain in the surface semiconductor layer across at least a portion of a lateral extent of the surface semiconductor layer between walls of one or more trenches formed in the etching. An integrated circuit device, for example a MOS transistor, is formed having an active region in the surface semiconductor layer.

Another aspect of the invention provides a method of manufacturing a semiconductor device including providing a semiconductor on insulator (SOI) substrate having a buried insulator structure above a base substrate. The SOI substrate has a surface semiconductor layer. The method proceeds by etching through the surface semiconductor layer, the stressed buried insulator structure and into the base substrate in a pattern defined by a mask layer. The method includes implanting ions into or through the buried insulator structure to induce stress within the buried insulator structure, thereby straining through the mechanism of edge relaxation the surface semiconductor layer across at least a lateral portion of the surface semiconductor layer between walls of one or more trenches formed in the etching. An integrated circuit device is formed having an active region in the surface semiconductor layer.

Still another aspect of the invention provides a semiconductor device comprising at least one MOSFET, the semiconductor device having a substrate comprising silicon and having first and second walls of one or more trench isolation structures extending partially into the substrate. A substrate interface region extends between the first and second walls and a buried insulation structure is provided on the substrate interface region. The buried insulation structure extends for a lateral extent between the first and second walls. The buried insulation structure comprises a material partially relaxed from an as-formed state of stress and the buried insulation structure has an insulating upper layer. A surface semiconductor layer is formed on the buried insulation structure, with the surface semiconductor layer extending between the first and second walls and having strain induced over at least a portion of the surface semiconductor layer extending between the first and second walls, the strain being induced by edge relaxation of stress in the buried insulation structure. A gate dielectric layer on the surface semiconductor layer separates the surface semiconductor layer from a gate electrode so that the surface semiconductor layer provides at least a part of a channel region of a MOSFET device.

In particularly preferred embodiments, if the buried insulator layer or layers has built-in compressive stress, that stress will be at least partially relaxed by edge relaxation when isolation trenches are etched and the surface layer will be at least partially strained in tension in the plane of the layers. Similarly, if the buried insulator layer or layers has built-in tensile stress, that stress will be at least partially relaxed by etching trenches and the surface layer will be at least partially strained in compression in the plane of the layers.

Still another aspect of the present invention provides a method of manufacturing a semiconductor device, including providing a first substrate comprising silicon and depositing a silicon germanium (abbreviated to $Si_xGe_{1-x}$) layer on the first substrate. The $Si_xGe_{1-x}$ layer has a higher concentration of germanium than the first substrate so that the $Si_xGe_{1-x}$ layer is in a state of in-plane compressive stress. A second substrate is provided that has an insulating layer on one surface and the second substrate is attached so that the insulating layer bonds to the $Si_xGe_{1-x}$ layer. A portion of the first substrate is removed to leave a surface silicon layer on the $Si_xGe_{1-x}$ layer. The method includes etching trenches through the surface silicon layer, the stressed $Si_xGe_{1-x}$ layer, the insulating layer and into the second substrate in a pattern defined by a mask layer, thereby straining the surface silicon layer across at least a portion of a width of the surface silicon layer between walls of one or more trenches formed in the etching. An integrated circuit device is formed having an active region in the surface silicon layer.

Yet another aspect of the present invention provides a method of manufacturing a semiconductor device including providing a first substrate comprising silicon. A $Si_xGe_{1-x}$ layer is deposited on the first substrate, the $Si_xGe_{1-x}$ layer having a higher concentration of germanium than the first substrate so that the $Si_xGe_{1-x}$ layer is in a state of in-plane compressive stress. The method provides a second substrate having an insulating layer on one surface and attaches the second substrate so that the insulating layer bonds to the $Si_xGe_{1-x}$ layer. A portion of the second substrate is removed to leave a surface silicon layer on the insulating layer. The method includes etching through the surface silicon layer, the insulating layer and the stressed $Si_xGe_{1-x}$ layer and into the first substrate in a pattern defined by a mask layer, thereby straining the surface silicon layer across at least a portion of a width of the surface silicon layer between walls of one or more trenches formed in the etching. An integrated circuit device is formed having an active region in the surface silicon layer.

BRIEF DESCRIPTION OF THE DRAWINGS

FIGS. 5, 6 and 7 illustrate portions of a CMOS device according to preferred embodiments of the present invention.

DETAILED DESCRIPTION

Figure 1:
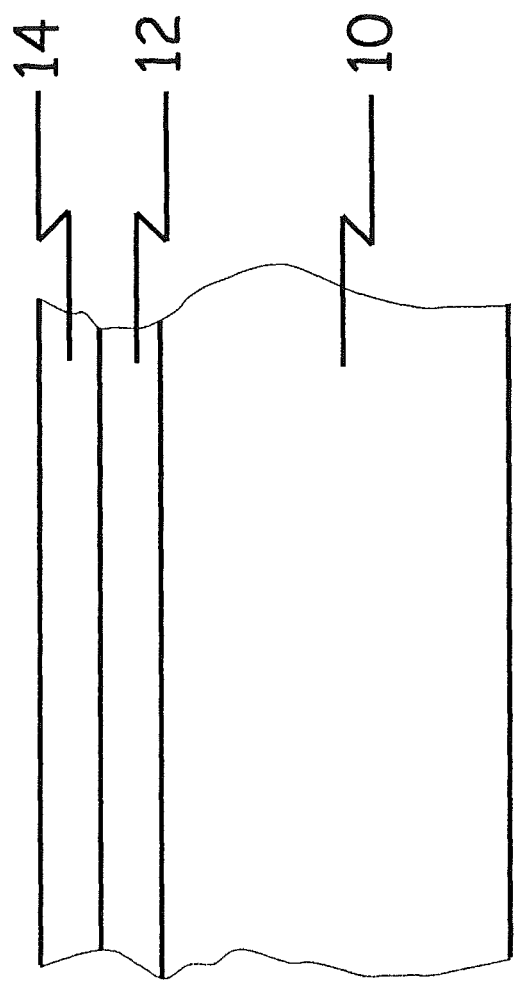
FIG. 1 shows schematically an SOI wafer according to an aspect of the present invention.

Particularly preferred implementations of the present invention may provide or may use a semiconductor on insulator wafer containing a compressively or tensilely stressed buried insulator structure. These compressively or tensilely stressed buried insulator layers and other implementations of compressively or tensilely stressed buried insulator structures are referenced here as stressed BOX structures or layers. Preferred SOI wafers including stressed BOX structures can advantageously be used to provide strained semiconductor regions and layers or to provide strained active regions within semiconductor device structures. Such structures are expected to achieve advantages of both strained silicon technology and SOI technology. The invention may be more broadly applied to semiconductor on insulator wafers where the semiconductor is a material other than silicon, for example germanium, silicon germanium, a III-V compound semiconductor, a II-VI compound semiconductor, silicon carbide or a nanoscale carbon in the form of graphene or nanotube. Devices manufactured in any of these semiconductor systems may benefit from tensile or compressive strain induced along one or more in-plane axes.

Preferred implementations of the invention form MOS transistors by etching isolation trenches into a preferred semiconductor on insulator substrate having a stressed BOX structure to define transistor active areas on the surface of the semiconductor on insulator substrate. The surface semiconductor layer preferably has a thickness of up to 50 nanometers. Most preferably the trenches are formed deep enough to penetrate through the stressed BOX structure and some distance into the underlying semiconductor portion of the substrate. The overlying thin semiconductor active regions will have tensile or compressive strain induced in-plane due to elastic edge relaxation. Without further processing the tensile or compressive strain will typically be biaxial in-plane and other processes can be used to achieve uniaxial strain when that is desired. In addition, the relative amounts of strain directed along each of the primary axes of a semiconductor device, corresponding to the width axis and length axis of a MOSFET, may be controlled independently through the spacing of the isolation trenches determined by the layout of the mask used to define the active area of the device. For example where in-plane strain is not desired in the semiconductor along a particular axis in a semiconductor device, the trenches preferably are spaced sufficiently far apart along that axis such that the effect of the edge relaxation mechanism is suitably minimized. The isolation trenches subsequently are filled with a suitable insulator using any of the trench isolation fill processes already well established in the CMOS IC industry or that may be introduced in the future. Preferably the trench fill is performed to maintain or achieve the desired strain properties of adjacent active regions. Other devices can be advantageously formed on active regions formed by etching trenches into SOI wafers having stressed BOX structures so that the trenches are etched to a sufficient depth and with an appropriate separation.

By proper selection of an insulator layer, substrate and a surface semiconductor layer, the insulator may be compressively or tensilely stressed and the surface layer may be tensilely or compressively strained in-plane. Silicon surface layers are particularly desirable at this time and so the remaining discussion emphasizes silicon on insulator (SOI) substrates and devices. It should be appreciated that the strategies discussed here can be implemented in various systems, including tensile or compressive stressed systems, surface layers other than pure silicon and insulators other than those specifically discussed here. Multiple layers may also be present on the substrate and surface semiconductor layer.

More generally, it is in some applications possible to use a buried layer, whether compressively or tensilely stressed, that is not an insulator. In this respect, it is possible that the structure that insulates the surface silicon layer from the substrate may incorporate a metal or conductive layer as part of the structure. It should nevertheless be appreciated that a silicon on insulator substrate or device is an especially preferred implementation of the present invention.

In-plane tensile strain can be created in a region of a thin layer of silicon by having an in-plane compressive stress in an underlying layer and etching closely-spaced isolation trenches through both layers. The thin layer of silicon preferably has a thickness of up to 50 nanometers and the trenches preferably are etched deep enough to ensure that the layer with compressive stress is able to relax laterally by elastic edge relaxation. Consequently the stress is reduced in the compressive layer in proximity to the isolation trenches and in-plane tensile strain is induced in adjacent layers (above and below) in proximity to the isolation trenches, including in the thin silicon layer on top of the compressive layer. If the underlying layer with compressive stress is at least partially insulating, after etching isolation trenches, the region of isolated silicon on top can be used to fabricate a silicon-on-insulator (SOI) device such as a fully depleted MOS transistor. As discussed, this is readily achieved with appropriate stresses and geometry according to the present invention. As such, the method permits the fabrication of strained thin body SOI devices with potentially low cost and low defect densities compared to other contemplated methods.

For preferred implementations, the strain distribution laterally through a semiconductor surface layer between trenches is non-uniform and often may have a peak near a lateral midpoint between the trenches. Under some geometries, it is possible for the semiconductor surface layer to have a region adjacent its edge near a trench where the in-plane strain is near zero or has an opposite character (e.g., compressive instead of tensile) than the in-plane strain the layer is designed to receive.

This disclosure incorporates by reference the text and teachings of U.S. Pat. No. 7,338,834, entitled Strained Silicon with Elastic Edge Relaxation, in its entirety. U.S. Pat. No. 7,338,834 describes, among other things, a thin (less than critical thickness) epitaxial layer of silicon germanium grown on a silicon wafer under biaxial compressive stress and a thin layer of silicon grown epitaxially on top of the silicon germanium layer. When shallow trench isolation structures are formed, as in conventional CMOS processing, the compressive stress in the silicon germanium is relaxed elastically at the trench sidewalls and the adjacent silicon layers above and below the silicon germanium layer are caused to be under in-plane tensile strain over a certain distance extending from the trench sidewalls. By controlling the separation of isolation trenches, which is the same as controlling the width and length of active areas, the amount and extent of tensile strain in the top layer of silicon may be adjusted independently in the width and length directions as preferred for the specific applications. Preferred methods and implementations of the present invention form active areas with strained silicon introduced by elastic edge relaxation, for example by forming appropriate trench isolation structures at desired separations on an SOI substrate that incorporates a stressed BOX structure.

Specific embodiments may make use of ion implantation to induce compressive stress in a buried layer of silicon nitride that may or may not have been in a state of stress before the ion implantation occurs. This particular embodiment of the method is favorable when the integrated circuit must be processed at high temperatures in the course of its manufacture, the high temperatures having the possible effect of reducing the built-in compressive stress in a layer of deposited silicon nitride. Ion-implant-induced stress may be implemented relatively late in the manufacturing process after stress-relieving high temperature steps, for example steps related to formation of the STI, have been completed. In addition ion implant-induced stress may be applied selectively to a specific subset of the MOSFETs in an integrated circuit by use of an implant mask pattern formed lithographically in a layer of photoresist. For example, it may be preferred to only implant the silicon nitride underlying n-channel MOSFETs in order to induce tensile strain in n-channels and avoid inducing tensile strain in p-channels.

In another implementation of the invention a strained active layer is created by use of a thin layer of Ge or SiGe below the active layer. The wafer is prepared by depositing a compressively stressed layer of Ge or SiGe that is of less than critical thickness on a donor wafer. The germanium or silicon germanium surface layer of the donor wafer is subsequently bonded to the product wafer, after which most of the donor wafer is separated by the SmartCut process as described in U.S. Pat. No. 7,534,701, leaving a thin and, at this point, unstrained silicon surface layer. The resulting wafer includes in sequence a silicon substrate, a layer of $SiO_2$ or other insulator, a layer of Ge or SiGe of less than critical thickness, and the surface silicon layer of thickness between 5 nanometers and 50 nanometers. During fabrication of integrated circuits, isolation trenches are cut with appropriate spacings to relieve some of the strain in the buried Ge or SiGe layer, inducing the desired strain in the active silicon layer.

In another implementation, a wafer includes sequential layers of a substrate, a layer of SiGe, an insulating layer, and a surface silicon layer. The SiGe layer is compressively strained as deposited. During fabrication of devices, isolation trenches are cut at appropriate spacing to relieve some of the strain in the SiGe layer, transmitting a stressing force to the overlying silicon layer through the insulating layer. Because the insulating layer separates the SiGe from the active silicon layer, defects in the SiGe layer will not affect the active silicon layer, so the amount of compressive stress in the SiGe layer is not limited to a critical thickness. The result is that the surface silicon layer in which devices are formed will be tensilely strained.

A preferred implementation of the invention manufactures an SOI wafer or substrate with a built-in compressive stress in the buried insulator (BOX) layer. The compressive stress may derive from a structure consisting of or including a layer of silicon nitride which can be deposited conveniently by a chemical vapor deposition (CVD) method under conditions which give rise to built-in compressive stress. Such deposition conditions are very well known in the silicon IC processing industry. The SOI wafer preferably is fabricated using a wafer bonding method. The major difference in the processing described here, as compared to conventional bonded SOI processing, is that this processing forms a buried insulator (BOX) layer that contains a layer of material under compressive or tensile stress as depicted in FIG. 1 (so creating stressed BOX structure 12), rather than forming a conventional BOX layer consisting only of unstressed silicon dioxide. Aspects of the wafer bonding and layer definition process can be found, for example, in U.S. Pat. No. 6,372,609, to Wristers, et al., which is incorporated by reference here for these and its other teachings. The top layer of silicon (layer 14 in FIG. 1) in which transistors will be fabricated is nominally unstrained when transistor fabrication begins and has a preferred thickness of up to 50 nanometers.

The stress created in the substrate or wafer by the preferred stressed BOX structure is then relaxed in part to portions of the surface active layer through preferred processes consistent with (but modified from) current CMOS processing. Normal CMOS IC processing uses trench isolation for device isolation and preferred embodiments take advantage of isolation trench formation to relax the stress in the BOX structure. Preferred processes etch isolation trenches through the stressed BOX structure and some distance into the underlying silicon or other substrate. When the trenches are etched, the compressive or tensile stress in the stressed BOX structure relaxes elastically at the edges of the active areas (i.e., at the trench sidewalls) and the at least partially relaxed BOX structure applies elastic stress to the silicon on either side (i.e., above and below) of the stressed BOX structure over a certain distance extending away from the trench sidewall. As should be apparent, the stressed BOX structure generally is not fully relaxed and the residual stress of the BOX structure is balanced in part by stress induced in the surface active region.

As described earlier, U.S. Pat. No. 6,372,609 to Wristers, et. al., describes a buried silicon nitride layer under compressive stress but provides no mechanism for inducing strain in a silicon active region above the compressively stressed buried silicon nitride layer. By contrast, preferred implementations of the present invention preferably provide edge relaxation by forming trench isolation structures or other trenching. Forming trench isolation structures or other forms of trenching is preferred for introducing strain in individual transistors in a semiconductor device when the starting point for device fabrication is a wafer containing a buried insulating structure including a stressor layer throughout the wafer.

Preferably, the method described here etches trenches not only through the active layer and the stressed silicon nitride layer, but also into and possibly through the BOX layer and partially into the substrate. This frees the stressed nitride layer to expand (or contract) much more substantially into the isolation trench regions, generating substantial strain throughout the surface active silicon region if the distance between trench walls is on the order of 800 nanometers or less, as is current industry practice for small geometry devices. Preferably the buried stressor layer, be it silicon nitride or some other material, should have an in-plane stress of magnitude greater than 200 megaPascal and preferably greater than 1 gigaPascal Simulations show that as much strain can be induced in the channel region of MOSFETs by this edge relaxation method as can be induced by the use of embedded source/drain stressors in bulk FETs.

The mechanism here is similar to that discussed in U.S. Pat. No. 7,338,834, entitled Strained Silicon with Elastic Edge Relaxation, incorporated by reference above. U.S. Pat. No. 7,338,834 primarily describes the use of a silicon germanium buried stressor material that is grown epitaxially on a silicon or other substrate. In contrast, certain preferred BOX materials such as silicon nitride or silicon nitride layered with silicon oxide cannot presently be grown epitaxially and so cannot be accommodated in a simple manner. Preferred implementations of the present invention can make use of stressors that are not readily deposited (or grown) epitaxially. As a practical consequence, preferred implementations of the present invention can provide an insulating compressive or tensile stressed layer that may have many practical advantages including for cost and flexibility of manufacturing.

Presently preferred implementations utilize silicon substrates and silicon active regions. Preferred methods described here also may be used to fabricate devices having surface layers or substrates (or both) formed from semiconductor materials other than silicon including but not limited to silicon germanium, germanium, gallium arsenide, gallium nitride, indium phosphide and silicon carbide. The methods described here also allow for the surface semiconductor layer to be put under either in-plane tensile strain or in-plane compressive strain. Preferred implementations of the present invention etch trench depths deeper than the total thickness of the surface semiconductor layer and the stressed buried insulator layer, typically to a depth between about 300 nm and 400 nm, similar to what is practiced in state of the art bulk CMOS integrated circuit fabrication, although the depth of the trenches may be less if the top semiconductor layer and the stressed buried insulator layer are much thinner as proposed in future ultra-thin body/ultra-thin BOX with approximately 10 nm surface active silicon and approximately 20 nm buried insulator thicknesses. This is unlike conventional SOI processing which typically does not etch trenches through the BOX layer because etching through a conventional BOX layer is unnecessary to achieve electrical isolation of transistors. Etching deeper trenches for deeper STI in SOI substrates is readily accomplished with conventional integrated circuit process technology. The present invention is particularly well suited to fully depleted ultra-thin body SOI applications because the transfer of stress into the overlying silicon layer is most effective when the silicon active layer is thin. The same principle of preferring thin surface layers applies to all of the non-silicon semiconductor materials referenced above, as well.

A preferred stressor layer within a preferred BOX structure with built-in compressive stress can conveniently be silicon nitride deposited with a built-in compressive stress. The stress may be in excess of one gigaPascal. The deposition conditions to achieve this are well known in the IC fabrication industry using commercially available equipment and processes. If the compressive layer is silicon nitride, it may be preferable to include thin layers of oxide on one or both faces of the compressive nitride layer where interfaces are formed to the top (active) silicon layer or the underlying silicon substrate wafer. Silicon oxide interfaces to silicon are likely to have bonding and electrical properties that are superior to those of silicon nitride interfaces to silicon.

In another embodiment of the invention compressive stress may be induced in a buried nitride layer by implantation of ions. Blanket implantation may be used to implant ions into or through all of a silicon nitride layer extending across a silicon wafer. Alternatively, the implantation of ions may be selectively applied to the nitride layer underlying some and not necessarily all of the MOSFETs in a manufactured integrated circuit by implanting only the nitride layer under selected MOSFETs with a moderate dose of ions. Inducing compressive stress in nitride regions by selective (masked) implantation may achieve the beneficial result that tensile strain is induced only in the overlying semiconductor layer of the selected MOSFETs. In a particularly favorable embodiment with a silicon channel layer, tensile strain may be induced only in the channel layers of re-channel MOSFETs and avoided in the silicon channel layers of p-channel MOSFETs by using an implant mask defined photolithographically in a layer of photoresist and implanting only the silicon nitride layer underlying the n-channel MOSFET devices.

A silicon nitride buried stressor layer may be provided on a surface of a silicon wafer by wafer bonding techniques. For example, various methods for forming a buried stressed silicon nitride or silicon oxynitride layer by wafer bonding are described in U.S. Pat. No. 6,707,106. Direct bonding of semiconductor nitride surfaces has been described in U.S. Pat. No. 5,503,704 entitled "Nitrogen Based Low Temperature Direct Bonding," in U.S. Pat. No. 5,904,860 "Method for Direct Bonding Nitride Bodies" and in several articles including Bower et al., "Low Temperature Si.sub.3N.sub.4 Direct Bonding," App. Phys. Letts., vol. 62, pp. 3485-3487 (1993), Yi, et al., "Systematic Low Temperature Silicon Bonding using Pressure and Temperature" Jap. J. Appl. Phys., vol. 37, pp. 737-741 (1998) and Harendt, et al., "Silicon Fusion Bonding and Its Characterization" J. Micromechanical Microengineering, vol. 2, pp. 113-116 (1992). U.S. Pat. Nos. 5,503,704 and 5,904,860 are incorporated by reference for their teachings with respect to direct bonding of wafers via silicon nitride layers.

It is desirable to preserve built-in stress in the buried silicon nitride (or other) stressor layer so that it may be utilized to induce strain in an overlying semiconductor layer when trenches are etched. Consequently, it is preferable that the direct bonding of silicon nitride to a silicon or other wafer be performed at a sufficiently low temperature to maintain the built-in stress (whether compressive or tensile) in a direct bonded silicon nitride layer. Silicon wafers coated with a thin thermal silicon oxide were direct bonded to a 140 nm thick silicon nitride layer to produce homogeneous bonded wafers with a bond strength of 0.9 $Jm^{-2}$ after an anneal at 800° C. Another strategy produced strong bonds between silicon nitride layers by bringing layers of $Si_3N_4$ into contact and subsequently annealing at temperatures between 90° C. and 300° C. Silicon wafers with thirty nanometer layers of silicon nitride on their surface were brought into contact and then annealed at 400° C. for four hours to produce an estimated bond strength of between 1.0 and 2.8 $Jm^{-2}$. In still another strategy, direct bonding was accomplished for two silicon wafers each with a surface covered with a plasma-enhanced chemical vapor deposition (PE-CVD) oxynitride, PE-CVD nitride or low-pressure (LP) CVD nitride. The wafers were brought into contact and annealed in air at temperatures in the range 200° C. to 500° C. for one to ten hours, producing stable bonds.

Spontaneous bonding of silicon wafers coated with silicon oxynitride or silicon nitride layers can occur if the surface roughness of the oxynitride or nitride layers is lower than 0.5 nm (RMS). For PE-CVD oxynitride or nitride layers, surface polishing by chemical-mechanical planarization is generally necessary to reduce the roughness and enable bonding or enhance the bonding quality. For example, bonding double-side polished silicon wafer pairs either with or without a LPCVD silicon nitride surface layer was successful for the bonding faces being either Si—$Si_3N_4$ or $Si_3N_4$—$Si_3N_4$. Pre-bonding "physical activation" was achieved by exposing one wafer of a pair or both wafers to an oxygen or argon plasma discharge immediately followed by immersion in deionized water for five minutes and spin drying. Subsequent to bonding at room temperature all wafers were annealed for two hours at 150° C., followed by a second annealing step for two hours at 350° C. Bond strength increased from 1.1 $Jm^{-2}$ after room temperature bonding to 2.2 $Jm^{-2}$ after annealing at 350° C. for two hours and higher annealing temperatures resulted in even stronger bonds.

Furthermore, using a silicon nitride bonding layer, it is possible to produce semiconductor-on-insulator wafers where the host wafer is silicon and the top semiconductor layer is other than silicon. An example of such heterogeneous semiconductor-on-insulator with buried nitride is suggested in Miclaus, et al., "Wafer Bonding of (211) $Cd_{0.96}Zn_{0.04}Te$ on (001) Silicon," J. Electron. Materials, vol. 32, pp. 552-555 (2004). The Miclaus article describes bonding of a compound semiconductor layer on a buried silicon nitride insulator layer but does not describe any method for inducing strain in the compound semiconductor layer. The bonding strategy of the Miclaus, et al., article can be included with the strain and edge relaxation strategies described here to induce strain in compound semiconductor materials including group II-VI materials such as cadmium telluride, cadmium-zinc telluride and mercury cadmium telluride and group III-V materials such as gallium arsenide, indium gallium arsenide, indium phosphide, indium gallium arsenide, gallium nitride, indium gallium nitride and aluminum nitride.

In certain preferred embodiments a BOX structure may be made from a compressively or tensilely stressed silicon nitride layer having a silicon dioxide layer on one or both of its upper and lower faces. If a silicon oxide layer intervenes between the stressed silicon nitride and the top semiconductor active layer, the silicon dioxide-semiconductor interface may have superior electrical properties in comparison with a silicon nitride-semiconductor interface. On the other hand, the stress induced in the top semiconductor layer by edge relaxation may be reduced if the intervening silicon dioxide layer acts as a stress buffer due to its inherent mechanical compliance and lowered viscosity during high temperature anneal cycles. Therefore in some circumstances it may be preferred to have the buried silicon nitride layer in direct contact with the uppermost semiconductor active layer. In other embodiments an insulating material other than silicon dioxide and having a stiffness greater than silicon dioxide may be inserted between the stressed silicon nitride layer and the surface active semiconductor layer. Insulating materials with high Young's Modulus (equivalently low compliance) and good electrical insulation properties include aluminum nitride, aluminum oxide, hafnium oxide, hafnium oxynitride, all of which may be deposited by known chemical vapor deposition (CVD) or atomic layer deposition (ALD) techniques. Compared with a Young's Modulus for silicon nitride which may be between 200 and 320 GPa depending on the deposition and treatment conditions for the silicon nitride thin film, aluminum nitride and aluminum oxynitride have bulk moduli of 200 GPa and 206-214 GPa respectively and aluminum oxide has an elastic modulus reported to be between 150 and 180 GPa. ALD hafnium oxide $HfO_2$ thin films and ALD aluminum oxide $Al_2O_3$ thin films have been measured to have an elastic modulus of between 180 GPa and 260 GPa. In general, insulating materials with a Young's modulus in the range 150 GPa to 250 GPa are preferred for a dielectric layer between the buried silicon nitride stressor layer and the surface active semiconductor layer.

A preferred method for fabricating a buried silicon nitride layer in direct contact with a top semiconductor active layer follows. In an exemplary process, a high quality silicon nitride thin film may first be formed on the surface of a donor silicon wafer by thermal nitridation, for example using a plasma source of free nitrogen atoms or a molecular nitrogen source such as ammonia ($NH_3$) and heating to a high temperature in the range 300° C. to 1050° C. and then a stressed silicon nitride or oxynitride layer may be subsequently deposited, followed by deposition of a thin film of silicon oxide. The purpose of a high quality nitride thin film is to provide a suitably high quality interface with low interface defect and trap densities between the silicon nitride and the silicon which is a desirable condition for good performance and reliability of MOS transistors subsequently fabricated in close proximity to the interface. The layered silicon-silicon nitride-silicon oxide wafer so formed may then be bonded to a silicon handle wafer using a standard method for wafer bonding involving a combination of applied pressure and thermal annealing as widely practiced in the semiconductor industry and described above, including in the above-incorporated U.S. Pat. No. 6,707,106. The silicon handle wafer may optionally have a silicon oxide layer formed upon it before the wafer bonding is performed to facilitate or improve the bonding process. Subsequently a majority of the donor wafer may be removed by a standard wafer separation process, such as the Smart Cut process employed by SOITEC, leaving a thin layer of silicon of desired thickness attached to the silicon nitride layers. U.S. Pat. No. 6,372,609 is incorporated by reference for its teachings with respect to processing buried insulating layers.

As discussed above, a preferred process for forming a BOX may include forming a high quality silicon nitride layer followed by depositing a compressively or tensilely stressed silicon nitride layer, followed by depositing a silicon oxide layer. Depositing the stressed silicon nitride layer may be accomplished, for example, by plasma enhanced chemical vapor deposition (PECVD) or low pressure chemical vapor deposition (LPCVD) process. By varying input factors in the CVD process, predictable amounts of either tensile or compressive built-in stress in the range 1.7 gigaPascal tensile to −3.0 gigaPascal compressive can be selectively incorporated in a deposited silicon nitride thin film. For example, Arghavani, et al. "A Reliable and Manufacturable Method to Induce a Stress of >1 GPa on a P-Channel MOSFET in High Volume Manufacturing," IEEE Electron Device Letters, Vol. 27, No. 2, 114-116 (2006) describes how a silicon nitride thin film with tensile built in stress of 1.2 GPa may be formed by LPCVD and a silicon nitride thin film with compressive built in stress of close to −3.0 GPa may be formed by PECVD. Furthermore, close to a 2.0 GPa tensile stress value can be achieved with UV cured LPCVD silicon nitride films.

Alternatively the layer with compressive stress may be a metal deposited with built-in stress formed by any known conventional method such as sputtering under low gas pressures typically in the range 0.1 milliTorr to 10 milliTorr. The metal layer with built-in compressive stress may be tungsten, molybdenum, titanium or an alloy of those metals or a metal compound such as a nitride of W, Mo or Ti, a silicide of W, Mo, Ti, Co or Ni or a boride of Hf or La. If the layer with compressive stress is a metal, the layer most preferably is electrically isolated from the top layer of silicon (or other semiconductor) by ensuring a thin insulating layer such as silicon dioxide is interposed between the metal and the silicon (or other) surface layer.

Preferred methods and implementations may deposit silicon nitride with built in compressive stress as the stressor layer within the stressed BOX structure. Preferred methods for creating and using the stressed BOX structure may deposit thin oxide layers both before and after deposition of the silicon nitride on the host wafer prior to the wafer bonding process. This particularly preferred stressed BOX structure provides silicon oxide layers, thin in comparison to the nitride layer, on either side of the silicon nitride layer to avoid direct contact between the nitride layer and adjacent silicon layers. In addition, it may be preferable to bond the active silicon layer to an oxide surface rather than a nitride surface.

Particularly preferred implementations deposit stressed silicon nitride on both sides of the host silicon wafer so as to avoid wafer bending by providing equivalent stresses on either side of the host wafer. It is desirable to maintain a flat wafer through both (a) the SOI bonding process and (b) the lithography process which defines the active areas and corresponding isolation trench pattern. With nitride on both faces of the silicon wafer, there will be stress balance, ensuring that wafer bowing is avoided or at least limited. After etching the isolation trenches to accomplish edge relaxation and hence induce strain in the surface semiconductor layer, preferred implementations etch the stress balancing silicon nitride layer off the back face of the silicon or other wafer because the stress on the front face will be released in large part by the trenches and therefore after etching the trenches a balancing stress on the reverse face is generally not required and generally not desired.

Other implementations of an SOI substrate with a stressed BOX structure use deposited conductive thin films with built-in compressive stress as the stressor layer in the stressed BOX structure. For example, the stressed BOX structure may consist of an embedded layer of compressively stressed electrically conductive material, encapsulated with insulator on one or both sides. Refractory metals such as tungsten, molybdenum and titanium or their alloys can be deposited with built-in compressive stress conveniently by using sputtering methods under conditions which are well known in the CMOS IC processing industry. The choice of stressed metal is restricted by the requirement that it be sufficiently chemically and physically stable to withstand the thermal budget and thermal shocks associated with the CMOS IC fabrication process. Other options for the embedded stressed conductive layer include metal borides (such as $LaB_6$, $HfB_2$) and metal carbides (such as HfC) and metal nitrides (such as HfN, TaN and TiN). Another alternative is to deposit a layer of undoped amorphous silicon and heavily dope the layer by high dose ion implantation of arsenic atoms then subsequently anneal the wafer to activate the arsenic and convert the amorphous silicon to polycrystalline silicon which will consequently be under compressive stress.

If a compressively stressed conductive layer is embedded in the BOX so as to create a stressed BOX, the conductive layer may subsequently be utilized as a back gate for SOI MOSFETs fabricated over the BOX structure.

Another preferred method and implementation uses as a buried stressor a layer of Ge or SiGe of less than critical thickness, as defined in U.S. Pat. No. 7,338,834. A first method is to prepare a wafer in which there is a layer of Ge or SiGe of less than critical thickness is provided between a silicon layer and a BOX covering a silicon substrate.

An initial step in this implementation deposits a Ge or SiGe layer on a donor substrate. This layer, being of less than critical thickness, is compressively strained. This contrasts to other known methods in which a graduated composition thick buffer layer of SiGe is deposited in substantially unstrained form and then a layer of unstrained SiGe of constant composition is deposited that will subsequently be used to strain the active silicon layer. This conventional structure mitigates the inevitable dislocations that arise from the graduated SiGe buffer layer. In the present implementation, there are very few or no dislocations since the Ge or SiGe thickness is purposely of less than critical thickness specifically to minimize or eliminate dislocations. After the donor Ge or SiGe layer is prepared, it is bonded to the receiving wafer, which consists of a layer of $SiO_2$ (or other insulator) on a silicon substrate. The process proceeds by removing all but a thin active silicon layer from the receiving substrate using known methods such as the Smart Cut process.

At this stage, the silicon active layer will be substantially unstrained. After the Smart Cut split occurs, the receiving (final) wafer will tend to push out at the edges since the Ge or SiGe will be able to expand somewhat. This is because the thin remaining active layer of silicon (5 to 20 nanometers) will not have sufficient force to fully restrain the compressed Ge or SiGe, and the BOX is also compliant enough to allow a small amount of expansion of the Ge or SiGe near the wafer edge. In the interior of the wafer the Ge or SiGe will retain most of its initial strain. Consequently, in the interior of the wafer, the active silicon layer will have very little strain until after trench formation. Modeling of the strain shows that the wafer edge relaxation will fully dissipate for the area of the wafer that is more than 500 nm from the edge. For a 300 mm wafer, a negligible portion of the surface silicon will be strained.

The wafer is further processed to construct devices. The further processing includes cutting isolation trenches with appropriate spacing to induce tensile strain in the active silicon layer as the Ge or SiGe layer expands into the voids created by the cutting of the isolation trenches through edge relaxation, as discussed above.

For future devices with a very thin active silicon layer that can provide a fully depleted condition, a thin layer of Ge, possibly of a thickness of less than 5 nanometers, may be desirable, and may induce a useful amount of stress. For thicker active layer, a layer of SiGe of less than critical thickness may be more desirable.

Another implementation places a layer of SiGe on the receiving substrate and then proceeds to create a silicon active layer with a buried insulator above the SiGe layer. This process creates an SOI wafer in which a layer of SiGe is positioned between the buried insulator and the silicon substrate. The SiGe layer will be compressively strained, and may be of greater than critical thickness. This contrasts with other methods discussed here, and in U.S. Pat. No. 7,338,834, in which care is taken to avoid dislocations by insuring that the SiGe layer is of less than critical thickness. The reason the thickness can be greater than the critical thickness in this case is that the insulating layer is interposed between the SiGe layer and the overlying active silicon layer, so dislocations in the SiGe layer are not propagated to the overlying silicon layer. Fabrication of devices includes forming isolation trenches, as discussed in more detail elsewhere in this application. This allows the SiGe layer under the BOX to expand. This in turn transmits a tensile strain force to the active silicon layer through the BOX.

If the BOX is heated above a threshold temperature during subsequent processing, it may soften and possibly begin to flow. When the BOX is heated and softens, the tensile strain induced in the active silicon layer may be reduced as the viscous layer of silicon dioxide decouples the stressor layer from the overlying active silicon layer. If the BOX is silicon dioxide, the upper limit of the temperature that does not cause softening is about 850° C. Other insulating materials that might be used for the buried insulator may have more desirable thermal properties.

If the isolation trenches are filled with a material that binds to the silicon active layer and is of low compliance, then some of the strain induced from the SiGe layer below the BOX structure will be retained even if the BOX itself softens in subsequent processing.

Forces creating stress are generally additive, and the SiGe under BOX method may be practiced in combination with other methods of creating stress.

Following formation of a desired SOI substrate having a stressed BOX structure a further preferred process then etches trenches according to a trench isolation process. The trenches define device active regions, including channels of MOSFETs, in the surface silicon layer. Most preferably, the trenches are positioned so that the active regions have a lateral extent, such as a MOSFET width, that is sufficiently small that relaxation can occur across the entire lateral extent of the stressed BOX structure between the trenches. The lateral extent may be about 500 nm or, more preferably, about 200 nm. As soon as the trenches are cut, and without further treatment, the compressive strain in the stressed BOX structure is able to partially relax, most advantageously in an elastic process, which induces substantial tensile strain in the surface silicon layer. Those of ordinary skill in the art will appreciate that in many modern configurations, active device regions will be surrounded by a continuous set of interconnected trenches. Even though such a set of interconnected trenches can be viewed as a single trench, for clarity, the present discussion refers to the etched openings on opposite sides of an active region as different trenches.

The new boundary formed at the surface of the trench sidewall allows the stressed BOX structure to extend outwards and in so doing to induce a tensile strain in the neighboring silicon lattices above and below the stressed BOX structure. Thus an in-plane tensile component of strain may be obtained in the overlying silicon layer. The tensile strain induced into the top silicon layer by this method may in general be non-uniform in its distribution but is of sufficient magnitude to improve the in-plane electron and hole mobilities to a desirable extent and hence to improve the electrical performance of MOS transistors having channels at least in part formed in the layer.

Figure 2:
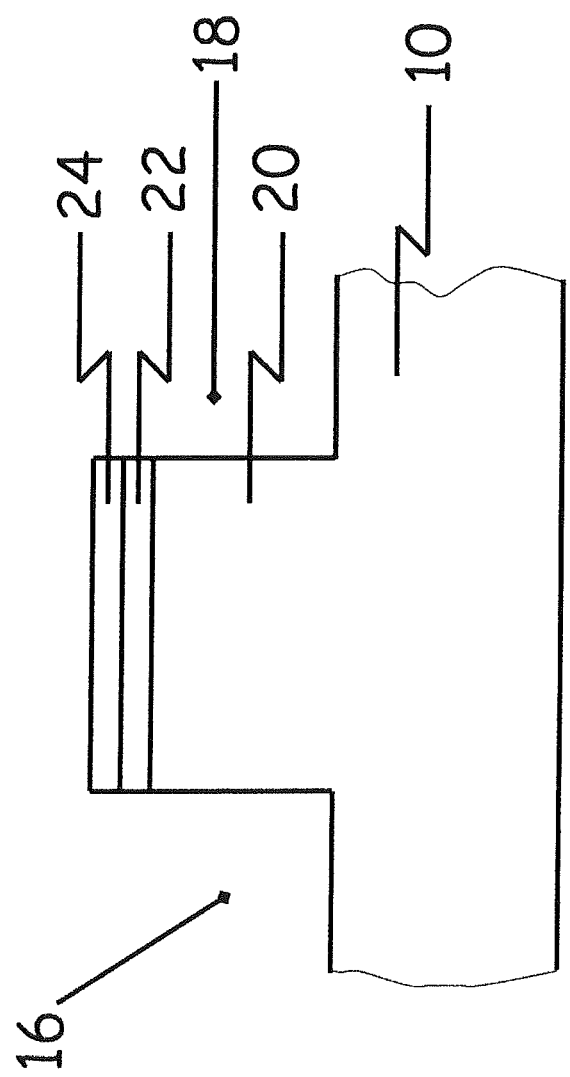
FIG. 2 shows schematically the wafer of FIG. 1 after further processing.

FIG. 1 illustrates in schematic cross section a substrate 10 having a BOX structure 12 and a surface semiconductor layer 14 formed by any of the strategies discussed above. Also as discussed above, the materials of substrate 10, BOX structure 12 and surface semiconductor layer 14 may be selected broadly in accordance with aspects of the present invention but will be described here in terms of a particularly preferred embodiment having a silicon substrate 10, a BOX structure 12 including a stressed silicon nitride layer and at least one oxide buffering layer and a surface silicon layer 14. Following formation of a preferred SOI wafer as illustrated in FIG. 1, a preferred process continues by etching trenches 16, 18 through the layers 14 and 12 and into the substrate 10 to a sufficient depth and with the trenches sufficiently closely spaced to allow edge relaxation to induce strain over a major portion of surface semiconductor layer 14. The end result of this process is illustrated in FIG. 2. The illustrated trenches 16, 18 can be formed using the processing typically used for trench isolation structures and preferably are formed to extend through the stressed BOX structure and partially into the underlying silicon substrate 10. As noted above, the trenches may be different portions of a continuous network of trenches. The sidewalls of the trenches define a surface region 20 of the substrate, a stressed BOX structure 22 on the substrate surface region 20, and a strained surface silicon layer 24 on the stressed BOX structure 22. Each of the region 20, layer 22 and layer 24 extend between the sidewalls of trenches 16 and 18. As discussed above, etching the trenches most preferably allows the stressed BOX structure 22 to relax and to induce tensile (or compressive) stress within the silicon layer 24 above the etched BOX structure 22.

The distribution of strain in the various layers following trench formation is inhomogeneous and the final strain distribution is strongly dependent on the geometry of the layered structures. Another consideration in determining the strain within a completed device is the material used to fill the etched trenches and the processes for etching and for filling the trenches. In most conventional trench isolation CMOS processes, the trench is first lined with a thermal oxide (a silicon oxide grown at high temperature in an oxidizing ambient) and then fill material (typically silicon dioxide) is deposited and, in some cases, annealed. This fill technology generally gives rise to additional compressive strain in the system which may be transferred into the active layer. Linear superposition principles apply to stresses, so if the conventional trench isolation fill scheme is employed, it may similarly impose an additional compressive component on top of the tensile strain in the silicon layer. Overall, the net strain in the active silicon layer will be more tensile. Furthermore, as is known in the art, it is possible to minimize the compressive stress induced by the trench isolation structure fill process by modifying the process conditions for the liner, dielectric fill and densification anneal, when such an anneal is used.

Figure 3:
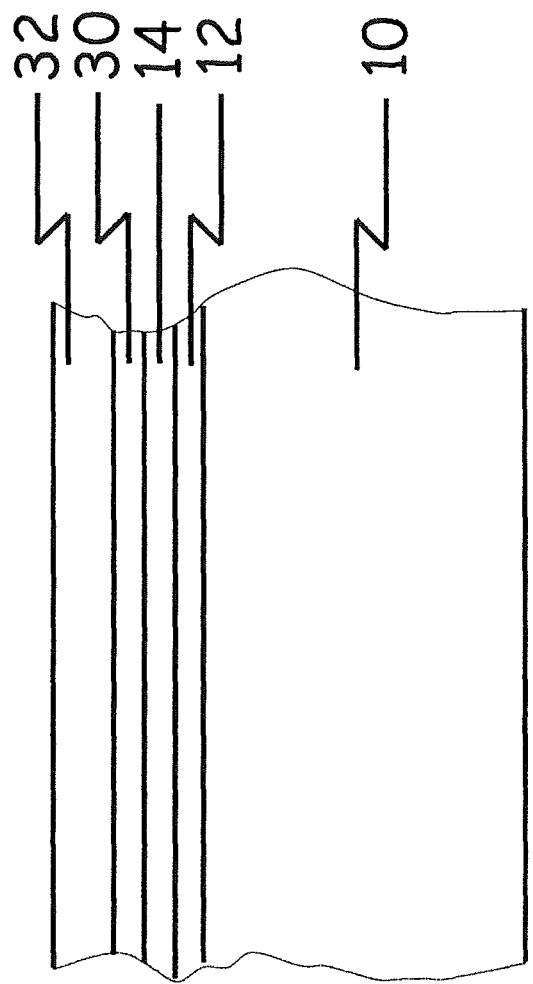
FIG. 3 illustrates the wafer of FIG. 2 after further processing.
Figure 4:
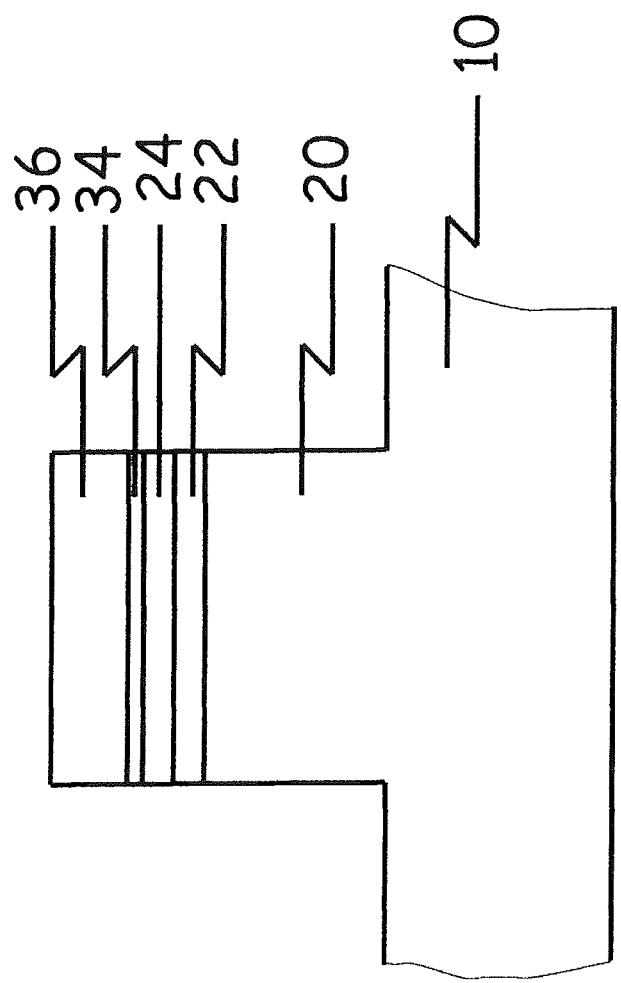
FIG. 4 illustrates the wafer of FIG. 3 after further processing.

A preferred manufacturing process according to the present invention involves forming trenches into an SOI substrate having a stressed BOX structure beneath a thin relaxed silicon surface layer. In conventional trench isolation technology, a hard mask (typically silicon nitride) is employed to pattern the trenches. Starting from the silicon substrate 10, stressed BOX structure 12 and silicon surface layer 14 structure illustrated in FIG. 1, a process may form a pad oxide layer 30, typically by thermal oxidation or chemical vapor deposition (CVD), followed by depositing a silicon nitride layer 32 by CVD in the manner illustrated in FIG. 3. Both the silicon nitride 32 and pad oxide 30 layers are patterned to form masking oxide 34 and nitride hard mask 36. Etching using the nitride mask 36 as a hard mask forms the structure illustrated in FIG. 4. The nitride mask 36 serves not only as a mask to the reactive ion etch (RIE) used to etch the trenches but also as a hard stop to the chemical mechanical polishing (CMP) used to planarize the silicon dioxide that fills the trenches. Because of this, the conventional trench isolation process leaves the patterned nitride 36 and oxide 34 mask in place until after planarization of the trench filling material is completed.

On the other hand, leaving the nitride hard mask 36 in place may inhibit the elastic strain relief when the trenches are etched, tending to cause the compressive strain to be retained in the etched stressed BOX structure 22 and the surface silicon layer 24 to not be strained to a desirable extent. In especially preferred embodiments, the trench isolation process is modified to more efficiently allow elastic relaxation. Possible modifications include using a nitride trench isolation structure liner or a more compliant pad oxide. For example, after the isolation trench etch is completed, the nitride hard mask can be removed. Preferably the hard mask is removed and elastic strain relaxation is allowed to take place uninhibited. Then a thinner nitride "liner" layer is deposited conformally over the isolation trench topography. This silicon nitride liner layer is used as the polish stop for the CMP planarization used after depositing an insulator such as silicon dioxide using, for example, high density plasma chemical vapor deposition. The nitride layer is subsequently removed from the top surface of the active area by a suitable etch process and remains on the trench sidewalls and the trench bottom.

Figure 5:
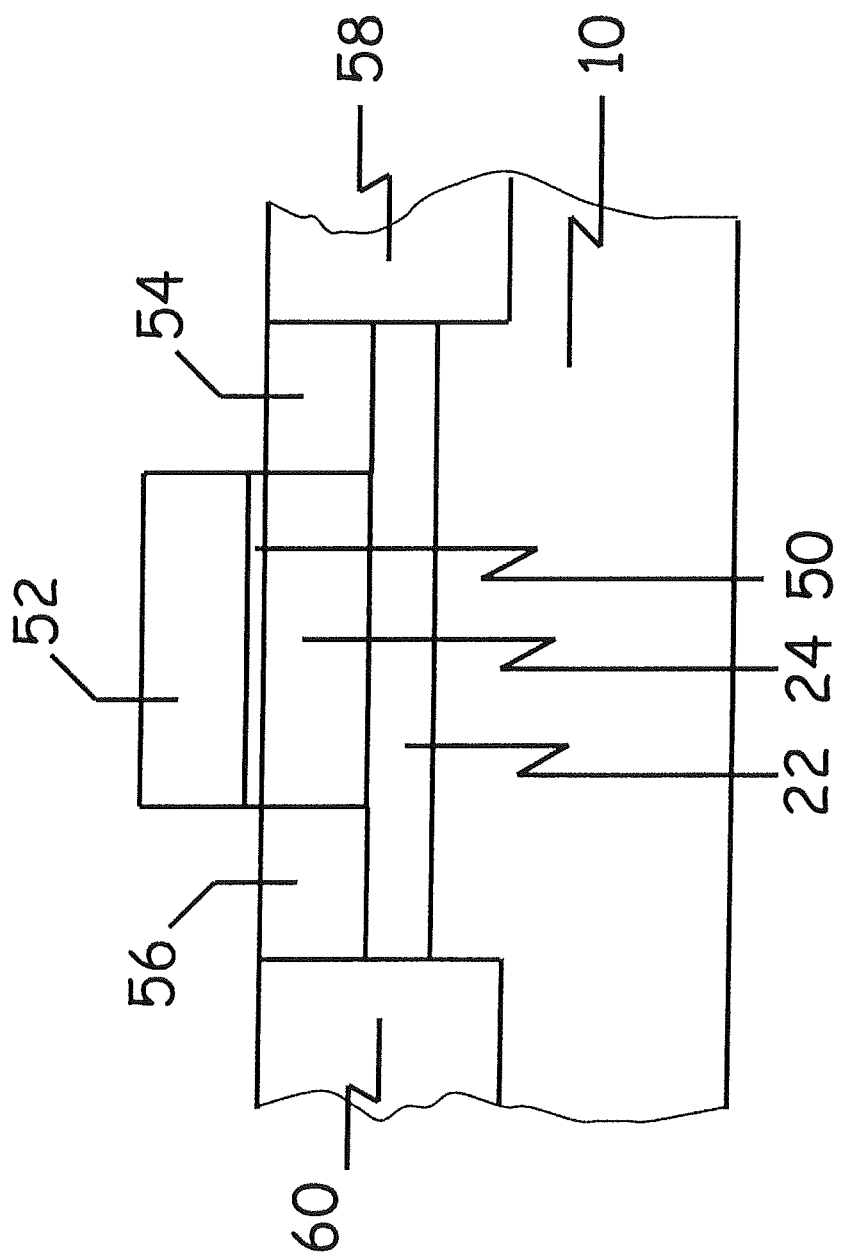

Further processing is preferably performed to form n-MOSFET devices and, as desired, p-channel MOSFET (p-MOSFET) devices and CMOS circuitry. An example of a portion of a CMOS device is illustrated in FIG. 5 which represents a two dimensional section through a MOSFET aligned along the longitudinal axis of the device. As shown, the partially relaxed stressed BOX structure 22 is provided over the substrate 10 and the strained silicon surface layer 24 covers the BOX structure 22. For the n-MOSFET portion of the CMOS device, gate dielectric 50 separates gate electrode 52 from the silicon surface layer 24. n-type source and drain regions 54 and 56 are provided on either end of the layer 24 so that the silicon surface layer 24 acts completely or at least partially as the channel region of the illustrated n-MOSFET device. In the illustrated configuration, shallow trench isolation structures 58, 60 are formed at the ends of the source and drain regions 54, 56.

Figure 6:
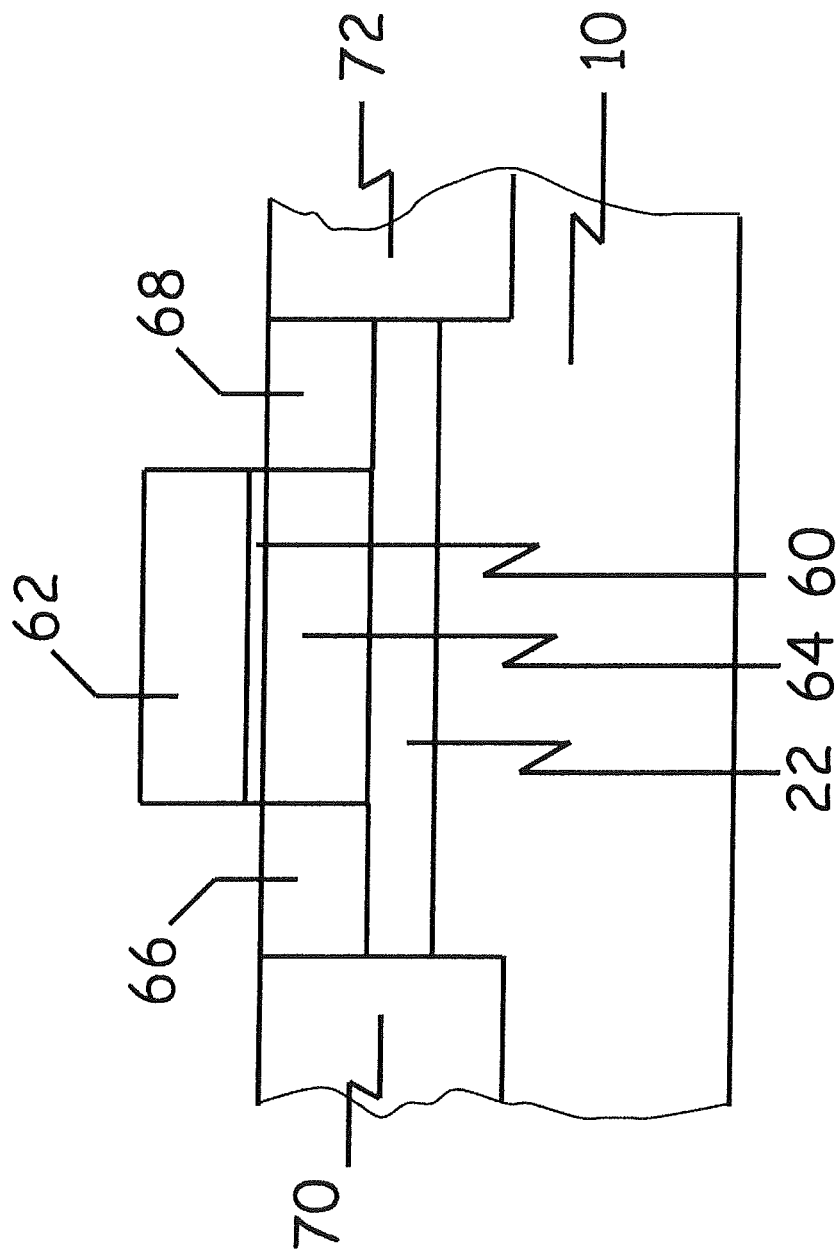

The described n-MOSFET device is preferably combined with a p-MOSFET in a CMOS device. For the p-MOSFET portion of the CMOS device, illustrated in FIG. 6, a gate dielectric 60 separates a gate electrode 62 from silicon surface layer 64. p-type source and drain electrodes 66, 68 are provided on either end of the silicon surface layer 64 so that the silicon surface layer 64 acts completely or at least partially as the channel region of the p-MOSFET device. In this configuration of a CMOS device, trench isolation structures 70, 72 are preferentially formed at the ends of the source and drain regions 66, 68 far from the channel region or not formed at all so as to avoid inducing a significant longitudinal tensile strain in the channel region by edge relaxation of the stressed BOX structure 22. Longitudinal compressive stress may additionally be introduced into the channel of the p-MOSFET by the application of SiGe source/drain stressors. In some implementations, the SiGe source/drain stresses may be in part raised above the level of the channel for example through epitaxial growth. For the orthogonal view of the p-MOSFET portion of the CMOS device shown in FIG. 7, gate dielectric 60 separates gate electrode 62 from silicon surface layer 64 and gate electrode 62 extends over trench isolation structures 74, 76. Trench isolation structures 74, 76 are preferentially formed with sufficiently small separation to define the width of the p-MOSFET and to induce a stress greater than 200 megaPascal across a major portion of surface layer 64 by edge relaxation of stressed BOX structure 22.

In some implementations, effective edge relaxation may be judged as inducing a level of stress of at least 200 megaPascal at some point over the span of a silicon surface layer between two trenches. Other material systems will have different preferred levels of stress. Effective edge relaxation can alternately be judged in some circumstances as developing a desirable level of stress in a surface layer across a major portion of a transverse lateral extent of a surface layer. In some implementations, a major portion may be judged as being fifty percent or more than fifty percent. In particularly preferred implementations, whether in these on in other embodiments discussed here, effective edge relaxation may be evaluated as inducing stress in a surface silicon layer of greater than 200 megaPascal over a transverse lateral extent of more than fifty percent of the transverse lateral extent width of a silicon surface layer.

Another consideration is the different impact that the in-plane stress components have on carrier mobilities. For electrons (in n-MOSFETs) it is generally understood that tensile strain is desirable along both the length and width axes of n-MOSFETs that are aligned along <110> axes of a (100) oriented substrate. That is, for n-MOSFETs, the piezoelectric coefficients are such that mobility increases with biaxial tensile strain. However, for holes, tensile strain is only desirable along the width axis for a similarly oriented p-MOSFET and uniaxial compressive strain is desirable along the length axis in such a p-MOSFET. This has led to the use of selectively grown SiGe stressors in the source and drain regions of p-MOSFETs to induce the desired uniaxial compressive strain in the silicon channel region.

Alternative implementations of the present invention can provide uniaxial compressive stress in the top silicon layer directed along the length of the channel in a p-MOSFET while still obtaining a tensile strain in the width direction of the p-MOSFET channel. Preferred implementations may beneficially use the technique of applying compressive stress in the p-channel by growing layers of epitaxial silicon germanium selectively in the source and drain regions of the p-MOSFET. Since stresses are superimposed linearly, the net effect of this action is the same as in conventional compressed silicon germanium source/drain implementations. Thus selective silicon germanium source and drain technology may be applied efficiently in implementations of the present invention to induce a uniaxial compressive strain along the length of a p-MOSFET in the same way as embedded silicon germanium source and drain stressors are applied in bulk silicon CMOS technology. Aspects of the present invention may provide a uniaxial transverse tensile strain in p-MOSFETs by edge relaxation of a compressively stressed buried insulator structure and this transverse tensile strain provides an improvement in channel hole mobility that is additive to the improvement in hole mobility arising from a uniaxial longitudinal compressive strain. This implementation provides an important advantage of allowing transverse tensile strain to be added to the channel of a p-MOSFET with no detraction from the longitudinal compressive strain introduced by SiGe source/drain stressors. In embodiments with extremely thin silicon on insulator where the silicon layer is too thin to accommodate an embedded silicon germanium stressor, the silicon germanium source and drain stressors may instead be raised epitaxial layers deposited selectively on top of the extremely thin silicon source and drain regions.

In another embodiment of the invention compressive stress may be induced in a buried nitride layer by implantation of ions. A buried silicon nitride layer is created, for example by wafer bonding or other method such as described above, but in a comparatively unstressed or a tensile stressed state. Processing continues until it is appropriate to induce stress, for example after isolation trench formation. A dose of ions of elements such as phosphorus, boron, carbon, germanium, silicon, arsenic, antimony, argon or oxygen is implanted with an areal dose in the range $1\times10^{13}$ to $1\times10^{15}$ ions per square centimeter and at an energy suitable to position the peak of the implanted ion distribution at a depth approximately midway between the top and the bottom of the buried nitride layer. Oxygen and germanium are presently particularly preferred ions to implant into or through a silicon nitride thin film in order to induce stress, which may include increasing the level of compressive stress or by reducing the level of tensile stress in a layer that has existing stress. Future implementations may favor other ions for inducing stress or altering the level of stress in a layer. Blanket implantation may be used to implant ions into or through the whole of a silicon nitride layer extending across a silicon wafer. Alternatively, the implant may be applied selectively to regions of the silicon nitride layer underlying a selected portion of the MOSFETs in a manufactured integrated circuit with the result that tensile strain is induced only in the overlying semiconductor layer of the selected MOSFETs. Selective implantation of the nitride underlying target MOSFETs can be achieved by using a select mask for the implant step, the select mask being defined for example lithographically in a layer of photoresist.

Before performing ion implantation to induce a net compressive stress in a buried silicon nitride layer, the silicon nitride may have approximately zero built-in stress or optionally may have tensile built-in stress. After implantation the buried nitride may be under compressive stress or have a negligible total stress. This method may be preferred for example to induce tensile stress only in the channels of n-channel MOSFETs by using a suitable ion implant mask and inducing compressive stress through implantation of ions only into the buried nitride underlying n-channels while avoiding inducing compressive stress in the nitride layer underlying p-channel MOSFETs. The compressive stress induced by implantation can be used to offset a previously existing tensile stress in a nitride region or can be used to induce a compressive stress in a nitride that does not previously have a significant built-in stress. Other processing is performed, for example as illustrated in FIGS. 1-7, with the implantation advantageously performed at an appropriate point in the processes illustrated in FIGS. 1-7 such as following trench formation or after most or all high temperature processing steps for the integrated circuit.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

What is claimed is:

1. A semiconductor device comprising:
 a substrate comprising silicon and having first and second walls of one or more trench isolation structures extending partially into the substrate, a substrate interface region extending between the first and second walls;
 an electrically conductive buried stressor layer on the substrate interface region and extending over a lateral extent between the first and second walls, the conductive buried stressor layer being a metallic thin film with built-in in-plane compressive stress;
 a buried insulation layer over the buried stressor layer;
 a surface semiconductor layer over the buried insulation layer, the surface semiconductor layer extending between the first and second walls and having in-plane tensile strain induced within a first portion of the surface semiconductor layer extending between the first and second walls, the strain induced by edge relaxation of the buried stressor layer; and
 an active semiconductor device circuit device having an active region at least partially in the first portion of the surface semiconductor layer.

2. The device of claim 1, wherein the electrically conductive buried stressor layer comprises at least one of tungsten, molybdenum, titanium, cobalt, nickel, hafnium, and lanthanum.

3. The device of claim 1, wherein the electrically conductive buried stressor layer comprises a refractory metal.

4. The device of claim 1, wherein the electrically conductive buried stressor layer comprises a metal boride, or a metal carbide, or a metal nitride.

5. A semiconductor device comprising:
 a substrate comprising silicon and having first and second walls of one or more trench isolation structures extending partially into the substrate, a substrate interface region extending between the first and second walls;

an electrically conductive buried stressor layer on the substrate interface region and extending over a lateral extent between the first and second walls, the conductive buried stressor layer being a conductive thin film with built-in in-plane compressive stress;

a buried insulation layer over the buried stressor layer;

a surface semiconductor layer over the buried insulation layer, the surface semiconductor layer extending between the first and second walls and having in-plane tensile strain induced within a first portion of the surface semiconductor layer extending between the first and second walls, the strain induced by edge relaxation of the buried stressor layer; and an active semiconductor device circuit device having an active region at least partially in the first portion of the surface semiconductor layer wherein the electrically conductive buried stressor layer comprises heavily doped polycrystalline silicon which is under compressive stress.

6. The device as in any one of claims 1-5, wherein the active semiconductor device is a semiconductor-on-insulator (SOI) MOSFET.

7. The device of claim 6, wherein the electrically conductive buried stressor layer is a back gate of the SOI MOSFET.

8. The device as in any one of claims 1-5, wherein the surface semiconductor layer comprises silicon.

9. The device as in any one of claims 1-5, wherein the surface semiconductor layer comprises germanium.

10. The device as in any one of claims 1-5, wherein the surface semiconductor layer comprises a compound semiconductor, and wherein the compound semiconductor is a II-VI or a III-V compound semiconductor.

11. The device as in any one of claims 1-5, wherein the buried insulation layer is silicon oxide.

* * * * *